(12) United States Patent
Xiao

(10) Patent No.: US 9,634,133 B1
(45) Date of Patent: Apr. 25, 2017

(54) METHOD OF FORMING FIN STRUCTURE ON PATTERNED SUBSTRATE THAT INCLUDES DEPOSITING QUANTUM WELL LAYER OVER FIN STRUCTURE

(71) Applicant: Zing Semiconductor Corporation, Shanghai (CN)

(72) Inventor: Deyuan Xiao, Shanghai (CN)

(73) Assignee: ZING SEMICONDUCTOR CORPORATION, Shanghai (CN)

( * ) Notice: Subject to any disclaimer, the term of this patent is extended or adjusted under 35 U.S.C. 154(b) by 0 days.

(21) Appl. No.: 15/067,196

(22) Filed: Mar. 11, 2016

(30) Foreign Application Priority Data

Oct. 27, 2015 (CN) .......................... 2015 1 0707751

(51) Int. Cl.
*H01L 21/336* (2006.01)
*H01L 29/78* (2006.01)
(Continued)

(52) U.S. Cl.
CPC ...... *H01L 29/7787* (2013.01); *H01L 21/0217* (2013.01); *H01L 21/0242* (2013.01); *H01L 21/0254* (2013.01); *H01L 21/0262* (2013.01); *H01L 21/02378* (2013.01); *H01L 21/02381* (2013.01); *H01L 21/02458* (2013.01); *H01L 21/02631* (2013.01); *H01L 21/28264* (2013.01); *H01L 21/3065* (2013.01); *H01L 21/30604* (2013.01); *H01L 21/31111* (2013.01); *H01L 21/32133* (2013.01); *H01L 21/823418* (2013.01); *H01L 29/0847* (2013.01); *H01L 29/155* (2013.01); *H01L 29/2003* (2013.01); *H01L 29/205* (2013.01);
(Continued)

(58) Field of Classification Search
CPC .......... H01L 21/02458; H01L 21/0254; H01L 21/30604; H01L 21/32133; H01L 21/823418; H01L 21/823431; H01L 29/41783; H01L 29/41791; H01L 29/66795; H01L 29/66818; H01L 29/785; H01L 29/7851; H01L 2029/7858
See application file for complete search history.

(56) References Cited

U.S. PATENT DOCUMENTS 9,029,222 B2 * 5/2015 Xiao ................. H01L 29/66795
257/24
9,209,289 B2 * 12/2015 Xiao ...................... H01L 29/778
(Continued)

*Primary Examiner* — Stephen W Smoot
(74) *Attorney, Agent, or Firm* — Kilpatrick Townsend & Stockton LLP

(57) ABSTRACT

Embodiments provide a quantum well device and the method for forming this device with high mobility and higher punch through voltages. For forming the quantum well device, a buffer layer can be formed on a patterned substrate of a quantum well device. A fin-like structure can be formed through an etching process performed to the buffer layer. A quantum well layer, a barrier layer, a cover layer and a dielectric layer can be successively deposited on the buffer layer and surface of the fin-like structure. A metal layer can then be formed on the surface of the said dielectric layer. Metal gate electrode and gate dielectric layer can be formed on the metal layer and dielectric layer. The cover layer, the barrier layer and the quantum well can then be etched to form recessed source and drain regions. Such a quantum well device can have better performance and reliability.

25 Claims, 12 Drawing Sheets

(51) Int. Cl.
*H01L 29/778* (2006.01)
*H01L 29/66* (2006.01)
*H01L 21/3065* (2006.01)
*H01L 21/311* (2006.01)
*H01L 21/3213* (2006.01)
*H01L 29/08* (2006.01)
*H01L 29/15* (2006.01)
*H01L 21/306* (2006.01)
*H01L 21/02* (2006.01)
*H01L 29/205* (2006.01)
*H01L 29/20* (2006.01)
*H01L 21/28* (2006.01)
*H01L 29/49* (2006.01)
*H01L 29/207* (2006.01)
*H01L 21/8234* (2006.01)
*H01L 29/417* (2006.01)

(52) U.S. Cl.
CPC ...... *H01L 29/207* (2013.01); *H01L 29/41791* (2013.01); *H01L 29/4966* (2013.01); *H01L 29/6656* (2013.01); *H01L 29/66462* (2013.01); *H01L 29/66795* (2013.01); *H01L 29/7851* (2013.01)

(56) References Cited

U.S. PATENT DOCUMENTS

| | | | |
|---|---|---|---|
| 2013/0045589 A1* | 2/2013 | Kim | H01L 21/26506 438/478 |
| 2013/0187207 A1* | 7/2013 | Tang | H01L 29/66795 257/288 |
| 2014/0054548 A1* | 2/2014 | Pillarisetty | B82Y 10/00 257/24 |
| 2015/0255610 A1* | 9/2015 | Xiao | H01L 29/207 257/190 |
| 2016/0005736 A1* | 1/2016 | Xiao | H01L 29/201 257/401 |
| 2016/0172495 A1* | 6/2016 | Zhu | H01L 21/82341 257/192 |
| 2016/0247726 A1* | 8/2016 | Huang | H01L 29/66545 |

* cited by examiner

METHOD OF FORMING FIN STRUCTURE ON PATTERNED SUBSTRATE THAT INCLUDES DEPOSITING QUANTUM WELL LAYER OVER FIN STRUCTURE

The present application claims the priority to Chinese Patent Applications No. 201510707751.1, filed with the Chinese State Intellectual Property Office on Oct. 27, 2015, which is incorporated herein by reference in its entirety.

TECHNICAL FIELD

The present invention relates to the field of semiconductor manufacturing and in particular to a quantum well device and the method for making the same.

BACKGROUND

The basic structure of high electron mobility transistor (HEMT) consists of a modulation-doped heterojunction and source-drain structure. The two-dimensional electron gas (2-DEG) existing in modulation-doped heterojunction is free from the ionized impurity scattering effects and thus exhibits very high mobility. HEMT is a voltage controlled device. The gate voltage Vg controls the depth of the potential well of the heterojunction, and thereby controlling the surface density of 2-DEG in the potential well which in turn controls the operating current of the device. In the GaAs HEMT structure, usually the n-AlxGa1-xAs control layer is depleted. If the n-AlxGa1-xAs layer is thicker and doping level is high, then there are 2-DEG even when Vg=0, thus a depletion mode device. Otherwise, it is an enhancement mode device (when Vg=0 the Schottky depleted layer extends to the internal of the intrinsic GaAs layer); for HEMT, it is mainly controlling the wide band gap semiconductor layer (the control layer) doping and thickness, and controlling thickness in particular. When considering the 2-DEG surface charge density Ns of HEMT, one usually only need to consider the two 2-dimensional band (i=0 and 1) of the heterojunction potential well. The 2-DEG surface charge density Ns will be controlled by the gate voltage Vg.

SUMMARY

The object of the present invention is to provide a quantum well device and the method for forming such device with high mobility.

To realize the above objective, present invention provides a method for the formation of a quantum well devices comprising the following steps:
  providing a patterned substrate;
  a buffer layer formed on the surface of the said patterned substrate;
  perform etching process to the said buffer layer to form a fin-like structure;
  successively deposit the quantum well layer, the barrier layer, the cover layer and the dielectric layer on the said buffer layer and surface of the fin-like structure;
  form a metal layer on the surface of the said dielectric layer;
  perform etching on the said metal layer and the dielectric layer to form metal gate electrode and gate dielectric layer;
  form sidewall spacer on both sides of the metal gate and a gate dielectric layers;
  successively etching the said cover layer, the barrier layer and the quantum well forming the recessed source and drain regions, and the exposed said buffer layer extending to the bottom of the sidewall spacer
  formed doped source and drain in the recessed source and drain regions.

Continue on further with the description of the method of forming the said quantum well device, the said substrate is patterned with Sigma-shape cavity.

Continue on further with the description of the method of forming the said quantum well device, the steps of forming the substrate with the said Sigma-shape cavity comprises:
  providing a substrate;
  forming a patterned mask layer on the substrate which reveals some of the patterned substrate;
  employ dry etching process to etch the exposed patterned substrate to form Bowl-shape cavities;
  employ wet etching process to etch the said Bowl-shape cavities to form Sigma-shape cavities;
  remove the said patterned mask layer.

Continue on further with the description of the method of forming the said quantum well device, the said wet etching process utilizes KOH or TMAH solution.

Continue on further with the description of the method of forming the said quantum well device, the said substrate material is silicon, sapphire or SiC.

Continue on further with the description of the method of forming the said quantum well device, the said buffer layer material is AlN or AlGaN with thickness in the range of 1 µm~10 µm.

Continue on further with the description of the method of forming the said quantum well device, the said buffer layer is deposited by MOCVD, ALD or MBE processes.

Continue on further with the description of the method of forming the said quantum well device, BCl3 gas is used in the etching of the said buffer layer to form a fin-like structure.

Continue on further with the description of the method of forming the said quantum well device, the material of the said quantum well layer is GaN, InGaN, AlGaN, germanium, elements of the III-V or II-VI groups with thickness in the range of 10 nm~100 nm.

Continue on further with the description of the method of forming the said quantum well device, the material of the said barrier layer is AlN, InGaN, AlGaN, and elements of III-V or II-VI groups, with thickness in the range of 10 nm~100 nm.

Continue on further with the description of the method of forming the said quantum well device, the material of the said cover layer is GaN with thickness in the range of 10 nm~50 nm.

Continue on further with the description of the method of forming the said quantum well device, the material of the said dielectric layer is silicon dioxide, aluminum oxide, zirconium oxide or hafnium oxide with a thickness in the range of 1 nm~5 nm.

Continue on further with the description of the method of forming the said quantum well device, the quantum well layer, the barrier layer, the cover layer and the dielectric layer are deposited by MOCVD, ALD or MBE processes.

Continue on further with the description of the method of forming the said quantum well device, the material for the said metal layer is NiAu or CrAu.

Continue on further with the description of the method of forming the said quantum well device, the said metal layer is deposited by PVD, MOCVD, ALD or MBE processes.

Continue on further with the description of the method of forming the said quantum well device, the material of the said sidewall spacer is silicon nitride.

Continue on further with the description of the method of forming the said quantum well device, wherein the formation of the recessed source and drain regions comprising the following steps:

Dry etching is used to successively remove the exposed cover layer, the barrier layer and the quantum well layer located on both sides of the said sidewall spacer and exposing the said buffer layer;

Wet etching is used to remove the cover layer, the barrier layer and the quantum well layer located beneath the said sidewall spacer to form the recessed source-drain regions, the non-overlapping part of the said source-drain recessed regions and said metal gate and gate dielectric layer.

Continue on further with the description of the method of forming the said quantum well device, the gas used in the said dry etching process is BCl3.

Continue on further with the description of the method of forming the said quantum well device, the wet etching process employs a solution containing 30%~50% of NaOH solvent to remove the said quantum well layer and cover layer.

Continue on further with the description of the method of forming the said quantum well device, the said wet etching process employs HF solution to remove the said barrier layer.

Continue on further with the description of the method of forming the said quantum well device, the said source and drain regions are made of silicon-doped GaN.

Continue on further with the description of the method of forming the said quantum well device, the said source and drain regions are formed by MOCVD, ALD or MBE processes.

Continue on further with the description of the method of forming the said quantum well device, source and drain electrodes are formed at the source and drain regions.

The present invention proposed a quantum well device, formed by the description of the method of forming the said quantum well device, including the following specifics: patterned substrate, buffer layer with fin-like structure, quantum well layer, barrier layer, cover layer, metal gate, gate dielectric layer, sidewall spacer and source-drain regions wherein the said fin-like structure of buffer layer is formed on the patterned substrate, the said quantum well layer, the barrier layer, the cover layer, the metal gate and gate dielectric layer are successively formed on the said buffer layer with fin-like structure, the said sidewall spacer is formed at both sides of the metal gate and the gate dielectric layer, the said source and drain regions are formed in the buffer layer, located at both sides of the metal gate and the gate dielectric layer with some parts extending to the bottom of the sidewall spacer.

Continue on further with the description of the method of forming the said quantum well device, also includes the source and drain electrodes, the said source and drain electrodes are formed on the said source and drain regions.

Compared with the prior art, the beneficial effects of the present invention lie mainly in the disclosure of a method of forming a quantum well device with high mobility and higher punch through voltages. As a result, such quantum well device will have better performance and reliability.

DETAILED DESCRIPTION

The following shall utilize schematic diagrams to describe in more details the present invention of a quantum well device and its method of formation. Although the example can be viewed as a preferred embodiment of the present invention, it should be understood that those skilled in the art can make modifications and still achieving the advantageous effects of the present invention. Thus, the following description should be understood as the general know-how of a skilled person in this field, but not as a limitation to the present invention.

For clarity purpose, not all features of an actual embodiment were described. In the following description, the well-known functions and structures are simplified as too many unnecessary details can cause confusion. In the development of any actual embodiment, a large amount of implementation details are carried out to achieve a specific developmental goal. For example, the embodiment may change according to specific system requirement or commercial limitation. Besides, one should also recognize that the complicated and time consuming development work are simply nothing but routine for a skilled person in this field.

In the following paragraphs, the present invention is described more specifically by utilizing specific examples in reference to the accompanying drawings. According to the following description and claims, advantages and features of the present invention will become more apparent. It should be noted however that the drawings, of simplified version and of approximate dimensions, are meant to facilitate more clearly the description of the embodiment of the present invention.

Figure 1:
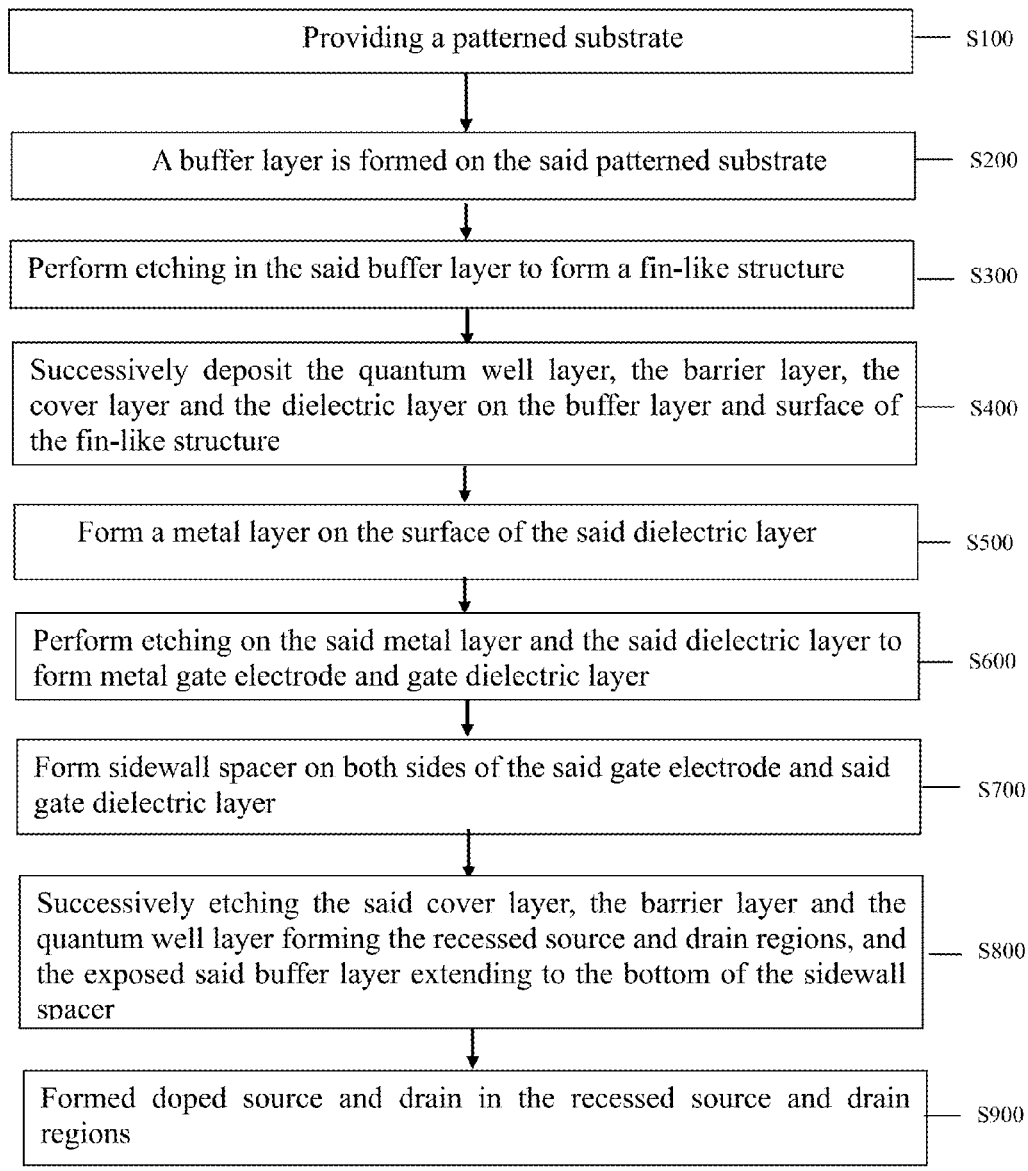
FIG. 1 is the present invention—a flowchart describing the embodiment of implementing the method of forming a quantum well device.

Please refer to FIG. 1, the present invention proposes the method of forming a quantum well device comprising the steps of:

S100: Providing a patterned substrate;

S200: A buffer layer is formed on the said patterned substrate;

S300: Perform etching in the said buffer layer to form a fin-like structure;

S400: Successively deposited the quantum well layer, the barrier layer, the cover layer and the dielectric layer on the buffer layer and surface of the fin-like structure;

S500: Form a metal layer on the surface of the said dielectric layer;

S600: Perform etching on the said metal layer and the said dielectric layer to form metal gate electrode and gate dielectric layer;

S700: Form sidewall spacer on both sides of the said gate electrode and said gate dielectric layer;

S800: Successively etching the said cover layer, the barrier layer and the quantum well forming the recessed source and drain regions, and the exposed said buffer layer extending to the bottom of the sidewall spacer;

S900: Formed doped source and drain in the recessed source and drain regions.

Figure 2A:
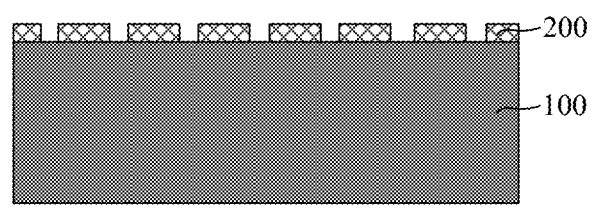
FIGS. 2a, 2b, 2c are the present invention—describing the embodiment of implementing the patterned substrate.
Figure 2B:
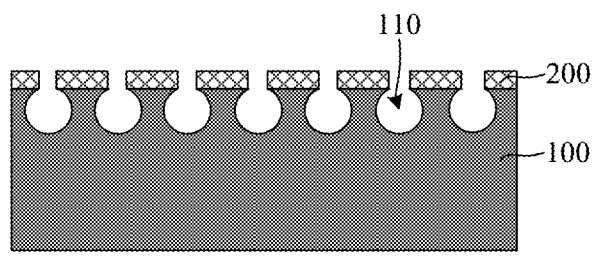
Figure 2C:
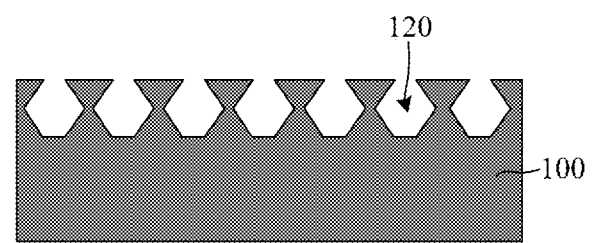

Specifically please refer to FIGS. 2a to 2c, in step S100, the said patterned substrate 100 is the substrate with Sigma-shape cavity. The steps of forming the said Sigma-shape cavity substrate 100 includes:

providing substrate 100, the material of the said substrate 100 may be silicon, sapphire or SiC;

form a patterned mask layer 200 on the said substrate 100, the patterned mask layer 200 exposes part of the substrate 100, the material of the said mask layer is silicon nitride;

employing dry etching process to etch the exposed substrate and form Bowl-shape cavity 110;

employing wet etching process to etch the said Bowl-shape cavity 110 to form a Sigma-shape cavity 120, in which the wet etch process utilizes KOH solution, or TMAH solution (Tetra Methyl Azanium Hydroxide);

remove the patterned mask layer 200.

Figure 3:
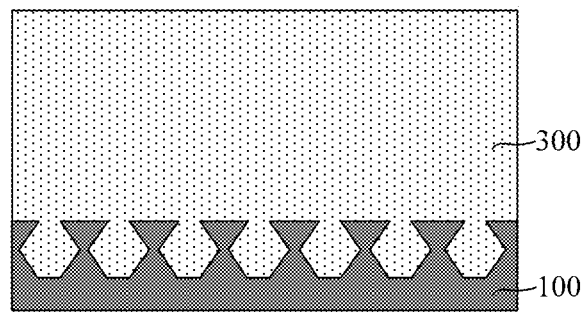
FIG. 3 is the present invention—showing the cross sectional view after the formation of the buffer layer of the embodiment of the invention.

Please refer to FIG. 3, in steps of S200, a buffer layer 300 is formed on the surface of the said patterned substrate 100; the material of the said buffer layer 300 is AlN or AlGaN with thickness in the range is 1 μm~10 μm, e.g., 5 μm. The said buffer layer 300 can be deposited by MOCVD (Metal Organic Chemical Vapor Deposition), ALD (Atomic Layer Deposition) or MBE (Molecular Beam Epitaxy) processes.

Figure 4A:
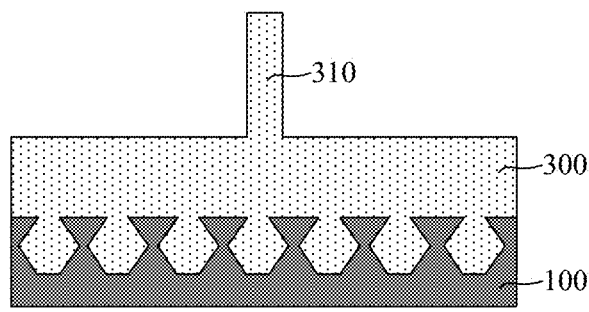
FIGS. 4a, 5a, 6a, 7a, 8a, 9a, 10a, 11a, 12a, and 13a are the present invention—schematic views of the embodiment showing the formation process of quantum well device along the direction perpendicular to the channel region.
Figure 4B:
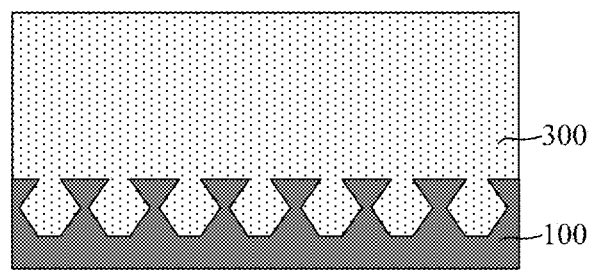
FIGS. 4b, 5b, 6b, 7b, 8b, 9b, 10b, 11b, 12b, and 13b are the present invention—schematic views of the embodiment showing the formation of quantum well device along the direction of the channel region.
Figure 5A:
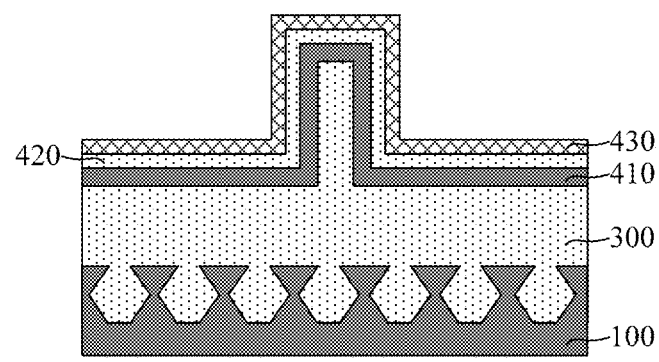
Figure 5B:
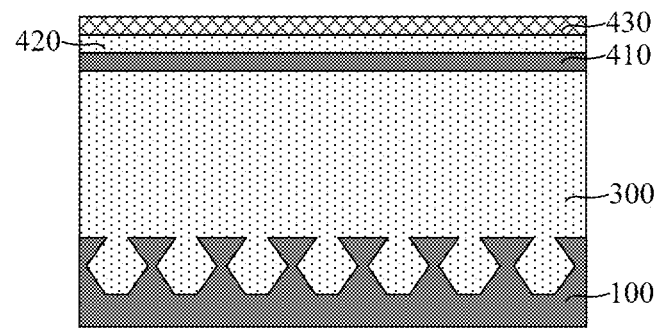
Figure 6A:
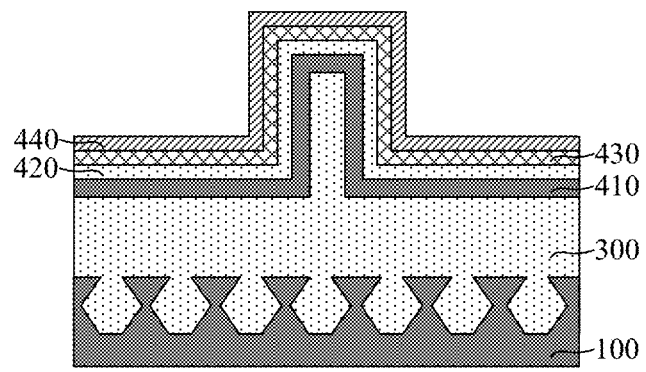
Figure 6B:
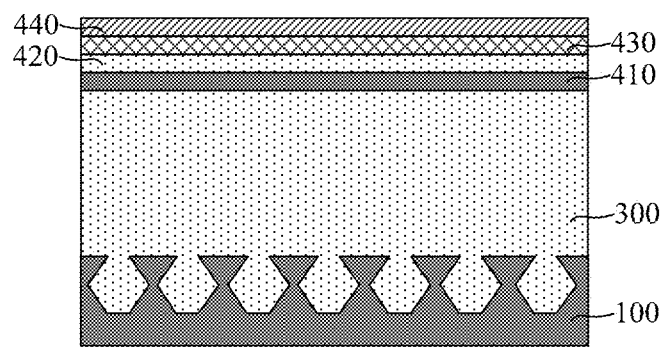

Continue on please refer to FIGS. 4a and 4b, using BCl3 gas to etch the said buffer layer 300 to form fin-like structure (Fin) 310.

Please refer to FIG. 5a, FIG. 5b, FIG. 6a and FIG. 6b, on the said buffer layer 300 and the fin-like structure 310 surface successively deposit quantum well layer 410, barrier layer 420, cover layer 430 and the dielectric layer 440; where by the material of the said quantum well layer 410 is GaN, InGaN, AlGaN, germanium, and elements of III-V or II-VI groups. In the present embodiment, it is GaN for example with thickness in the range of 10 nm~100 nm, e.g. 50 nm. The material of the said barrier layer 420 is AlN, InGaN, AlGaN, elements of III-V or II-VI groups. In the present embodiment, it is AlN for example with a thickness in the range of 10 nm~100 nm, e.g. 50 nm. Wherein the material of the barrier layer and the quantum well layer can be the same but with different components. The forbidden bandgap width of the barrier layer material must be greater than the forbidden bandgap width of the quantum well layer material. The said cover layer 430 is GaN with thickness in the range of 10 nm~50 nm, e.g. 20 nm. The material of the said dielectric layer 440 is silicon dioxide, aluminum oxide, zirconium oxide or hafnium oxide with thickness in the range of 1 nm~5 nm, e.g. 3 nm. Wherein the said quantum well layer 410, the barrier layer 420, the cover layer 430, and the dielectric layer 440 can be deposited by MOCVD, MBE or ALD processes. The formed quantum well layer 410, the barrier layer 420, the cover layer 430 structures and the modulation-doped heterojunction quantum well layer 410 can form a two-dimensional electron gas (2-DEG, shown as dotted lines in the quantum well layer 410 in the Figures) free of ionized impurity scattering thus very high mobility. As a result, the quantum well device formed with such structure has higher mobility.

Figure 7A:
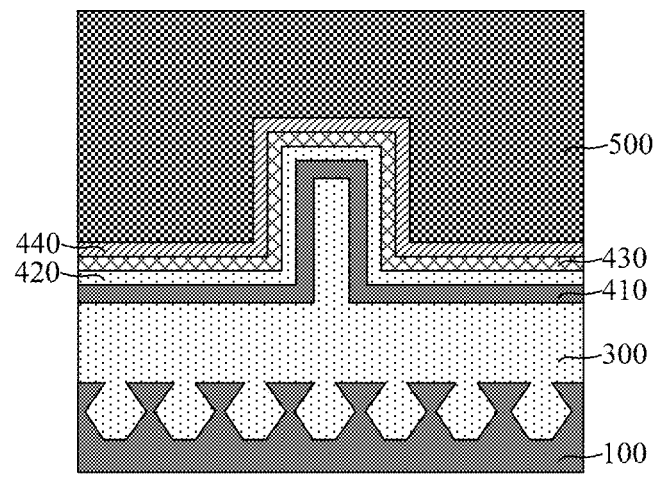
Figure 7B:
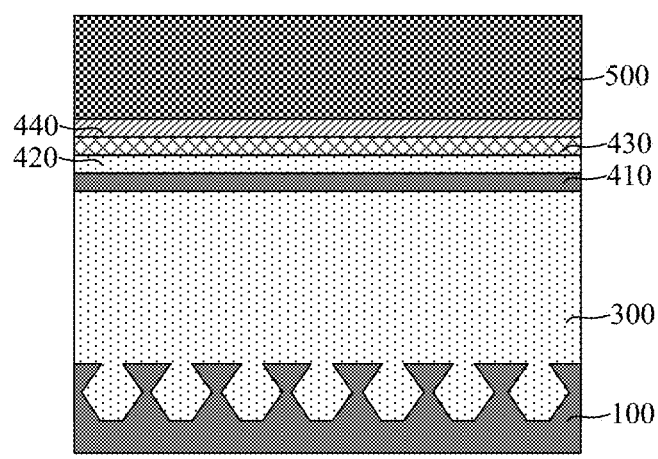

Please refer to FIGS. 7a and 7b, metal layer 500 is formed on the surface of the said dielectric layer 440; the material of the said metal layer 500 is NiAu or CrAu deposited by PVD (Physical Vapor Deposition), MOCVD, ALD or MBE processes.

Figure 8A:
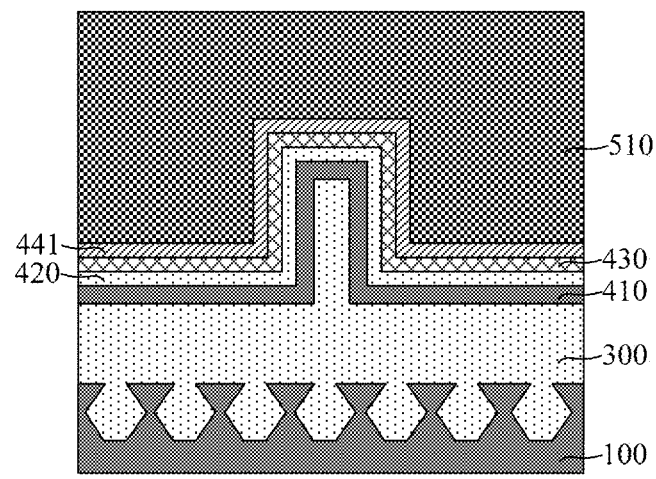
Figure 8B:
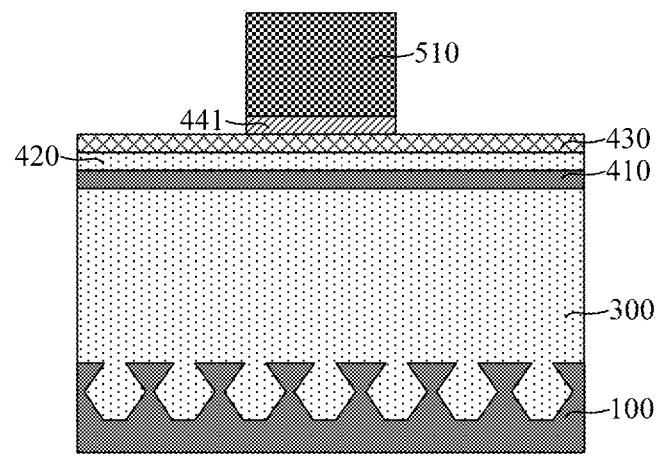

Please refer to FIGS. 8a and 8b, perform etching to the said metal layer 500 and dielectric layer 440 to form metal gate 510 dielectric and gate dielectric layer 441.

Figure 9A:
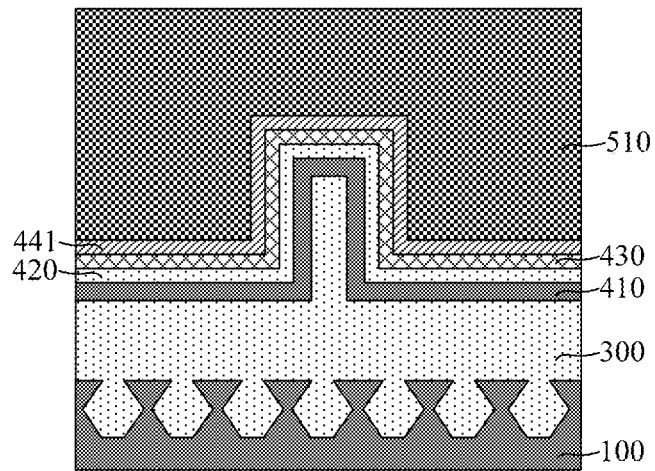
Figure 9B:
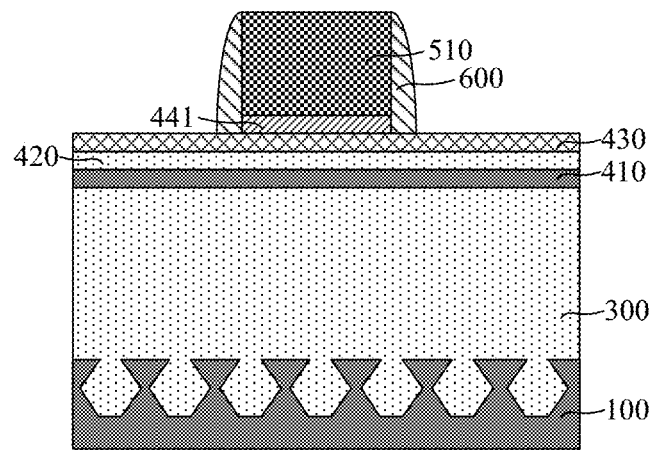

Next, please refer to FIGS. 9a and 9b, form the sidewall spacer 600 on both sides of the metal gate 510 and the gate dielectric layer 441; the material of the said sidewall spacer is silicon nitride.

Figure 10A:
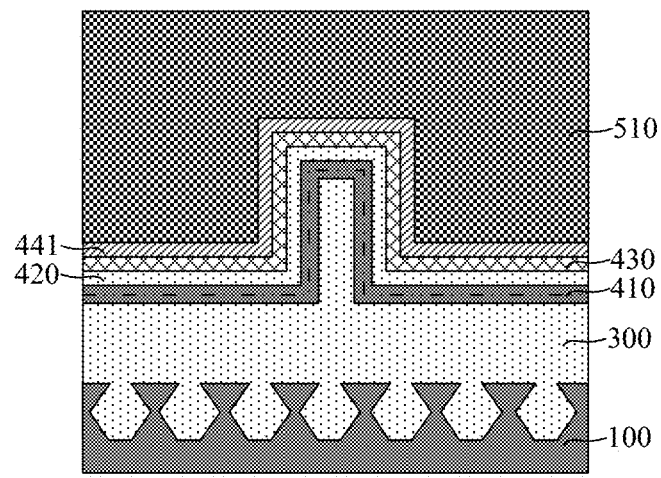
Figure 10B:
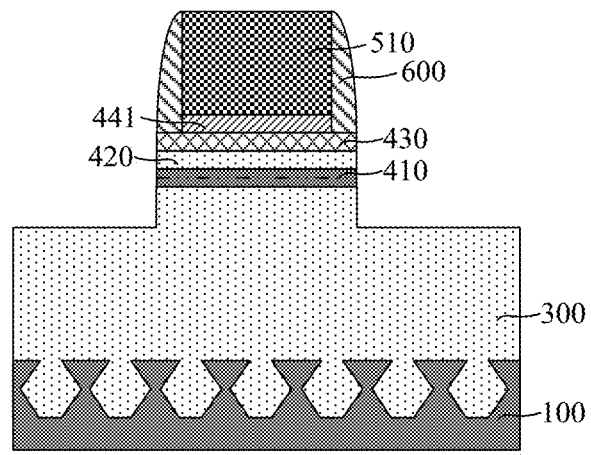

Next, successively etching the said cover layer 430, the barrier layer 420 and the quantum well layer 410 forming the recessed source-drain regions, the said recessed regions exposing the said buffer layer 300 and extending to the lower portion of the said sidewall spacer 600, but not overlapping the region of the said metal gate 510 and gate dielectric layer 441;

Specifically, the formation steps of the said source and drain recessed regions include:

Dry etching is used to successively remove the exposed regions of the cover layer 430, the barrier layer 420 and the quantum well layer 410 located on both sides of the said sidewall spacer and exposing the said buffer layer 300, as shown in FIGS. 10a and 10b. The gas used in the said dry etching process is BCl3.

Figure 11A:
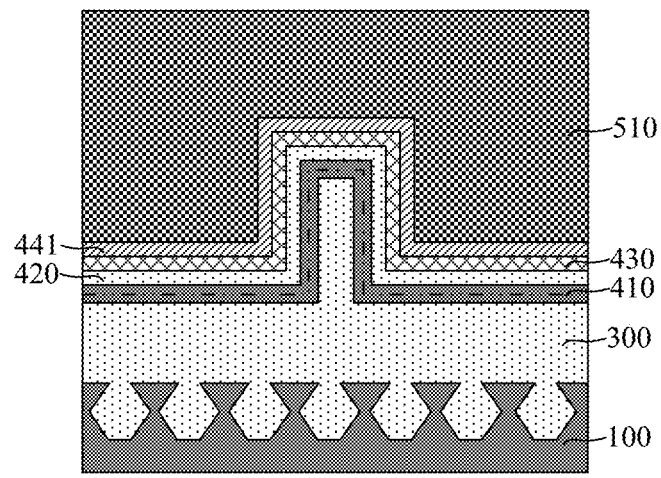
Figure 11B:
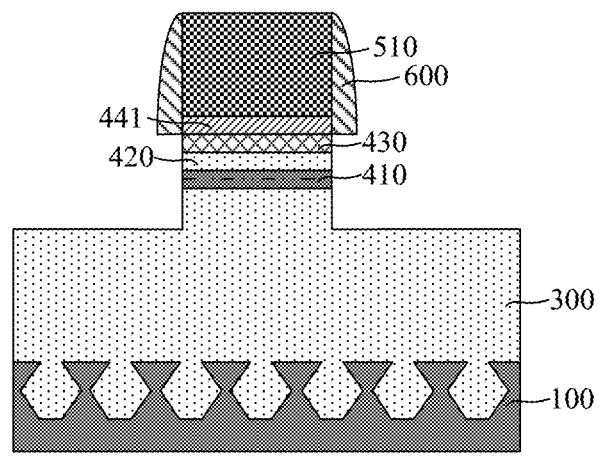

Wet etching is used to successively remove the cover layer 430, the barrier layer 420 and the quantum well layer 410 located beneath the said sidewall spacer 600 to form the recessed source-drain regions, the non-overlapping part of the said source-drain recessed regions and the said metal gate 510 and gate dielectric layer 441, as shown in FIGS. 11a and 11b. The wet etching process employs a solution containing 30%~50% of NaOH solvent to remove the said quantum well layer 410 and the cover layer 430. The material of both the quantum well layer 410 and the cover layer 430 in the present embodiment is GaN. The wet etching process employs HF solution to remove the barrier layer 420. The material of the said barrier layer 420 in the present embodiment is AlN.

Figure 12A:
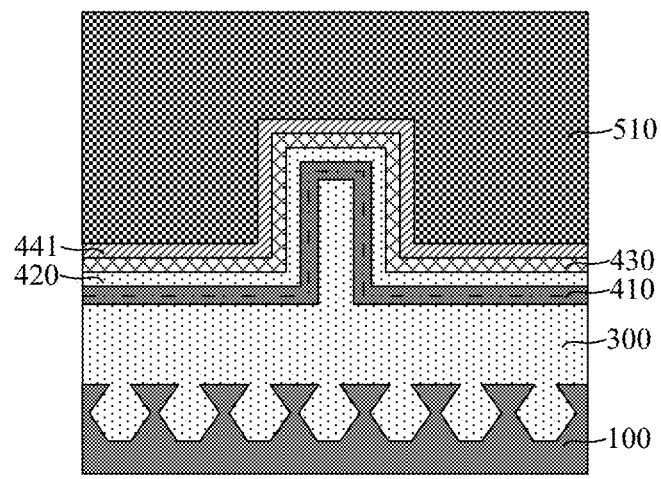
Figure 12B:
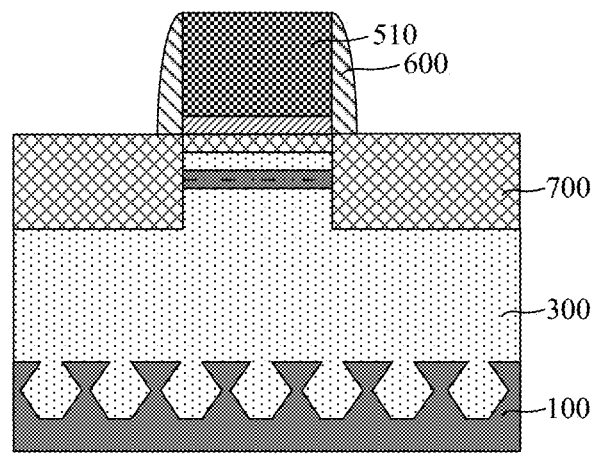

Next, please refer to FIGS. 12a and 12b, form doped source and drain 700 at the recessed source and drain regions. The material of the source and drain region 700 is silicon-doped GaN and deposited by MOCVD, ALD or MBE processes.

Figure 13A:
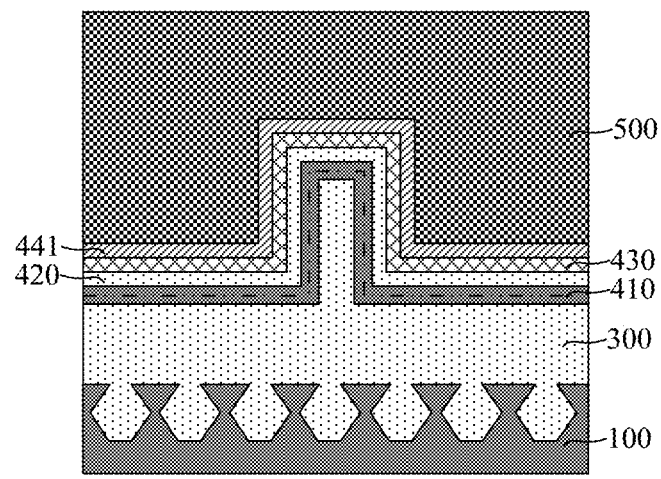
Figure 13B:
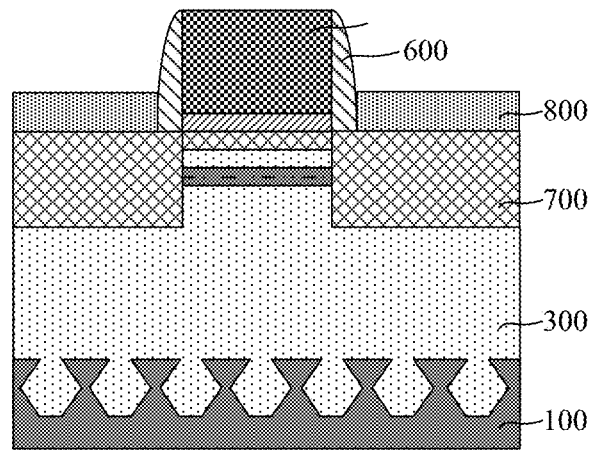

Next, please refer to FIGS. 13a and 13b, the source and drain electrodes 800 are formed on the source and drain region 700.

In another aspect, a type of quantum well device is also proposed in the present embodiment, utilizing the said method of formation of the quantum well device, comprising: a patterned substrate 100, a buffer layer 300 with fin-like structure 310, a quantum well layer 410, a barrier layer 420, a cover layer 430, metal gate 510, gate dielectric layer 441, sidewall spacer 600 and the source-drain regions 700. Wherein the buffer layer 300 with fin-like structure 310 is formed in on the said patterned substrate 100. The said quantum well layer 410, the barrier layer 420, the cover layer 430, metal gate 510 and the gate dielectric layer 441 are successively formed on the said fin-like structure 310 and buffer layer 300. The said sidewall spacer 600 is formed at both sides of the said metal gate 510 and the gate dielectric layer 441. The said source-drain regions 700 is formed on the said buffer layer 300 at both sides of the metal gate 510 and gate dielectric 441 and extends to the part beneath the said sidewall spacer 600, but not overlapping the region of the said metal gate 510 and gate dielectric layer 441. In addition, the quantum well device also include the source and drain electrodes 800 formed at the source and drain regions 700.

In summary, in the embodiment of the present invention of a quantum well device and its method of formation, proposed a method of forming a quantum well device with higher mobility and higher punch through voltages, resulting in a quantum well device with better performance and reliability.

The above exemplified the embodiment of the present invention but setting no limitations to it. Any technical person skilled in the art, without departing from the technical scope of the present invention, making equivalent changes or modifications to the disclosed technical scopes and content of the present invention are still within the claims of the present invention.

What is claimed is:

1. A method of forming a quantum well device is characterized by the specific formation steps as follows:
   providing patterned substrate;
   a buffer layer is formed on the said patterned substrate;
   perform etching in the said buffer layer to form a fin-like structure;
   successively deposit a quantum well layer, a barrier layer, a cover layer and a dielectric layer on the buffer layer and surface of the fin-like structure;
   form a metal layer on the surface of the said dielectric layer;
   perform etching on the said metal layer and the said dielectric layer to form metal gate electrode and gate dielectric layer
   form sidewall spacer on both sides of the said gate electrode and said gate dielectric layer;
   successively etching the said cover layer, the barrier layer and the quantum well layer to form recessed source and drain regions, and the exposed said buffer layer extending to the bottom of the sidewall spacer;
   forming doped source and drain in the recessed source and drain regions.

2. The method of forming a quantum well device as described in claim 1, its characteristic lies in the said substrate is patterned with Sigma-shape cavity.

3. The method of forming a quantum well device as described in claim 2, its characteristic lies in the said substrate with Sigma-shape cavity is formed by the following specific steps:
   providing a substrate;
   forming a patterned mask layer on the said substrate, the patterned mask layer reveals some part of the substrate;
   utilizing dry etching technique to etch the exposed substrate area forming Bowl-shape cavity;
   utilizing wet etching technique to etch the exposed substrate region in the Bowl-shape cavity and form the Sigma-shape cavity in the substrate;
   remove the patterned mask layer.

4. The method of forming a quantum well device as described in claim 3, its characteristic lies in the wet etching is performed by KOH or TMAH solution.

5. The method of forming a quantum well device as described in claim 1, its characteristic lies in the said substrate material is silicon, sapphire or SiC.

6. A method of forming quantum well devices as described in claim 1, its characteristic lies in the material of the said buffer layer is AlN or AlGaN with thickness in the range of 1 μm~10 μm.

7. The method of forming a quantum well device as described in claim 1, its characteristic lies in the said buffer layer is deposited by MOCVD, ALD or MBE processes.

8. The method of forming a quantum well device as described in claim 1, its characteristic lies in the fin-like structure is formed by using BCl3 to etch the said buffer layer.

9. The method of forming a quantum well device as described in claim 1, its characteristic lies in the material of the said quantum well layer is GaN, InGaN, AlGaN, germanium, elements of III-V or II-VI groups, with thickness in the range of 10 nm~100 nm.

10. The method of forming a quantum well device as described in claim 1, its characteristic lies in the material of the said barrier layer is AlN, InGaN and AlGaN, and elements of III-V or II-VI groups with thickness in the range of 10 nm~100 nm.

11. The method of forming a quantum well device as described in claim 1, its characteristic lies in the said cover layer is GaN with thickness in the range of 10 nm~50 nm.

12. The method of forming a quantum well device as described in claim 1, its characteristic lies in the material of the said dielectric layer is silicon dioxide, aluminium oxide, zirconium oxide or hafnium oxide with thickness in the range of 1 nm~5 nm.

13. The method of forming a quantum well device as described in claim 1, its characteristic lies in the said quantum well layer, the barrier layer, the cover layer and the dielectric layer are deposited by MOCVD, ALD or MBE processes.

14. The method of forming a quantum well device as described in claim 1, its characteristic lies in the said material for the metal layer is NiAu or CrAu.

15. The method of forming a quantum well device as described in claim 1, its characteristic lies in the said metal layer is deposited by PVD, MOCVD, ALD or MBE processes.

16. The method of forming a quantum well device as described in claim 1, its characteristic lies in the material of the said sidewall spacer is silicon nitride.

17. The method of forming a quantum well device as described in claim 1, its characteristic lies in the formation of the said recessed source and drain regions include the following steps:
   dry etching is used to successively remove the exposed cover layer, the barrier layer and the quantum well layer located on both sides of the sidewall spacer, exposing the said buffer layer;
   wet etching is used to remove the cover layer, the barrier layer and the quantum well layer beneath the said sidewall spacer layer, forming the recessed source-drain region, a non-overlapping part of the said recessed source-drain regions and the said metal gate and the gate dielectric layer.

18. The method of forming a quantum well device as described in claim 17, its characteristic lies in a gas used in the dry etching process is BCl3.

19. The method of forming a quantum well device as described in claim 17, its characteristic lies in the wet etching process employs a solution containing 30%~50% of NaOH solvent to remove the said quantum well layer and cover layer.

20. The method of forming a quantum well device as described in claim 17, its characteristic lies in the wet etching process employs HF solution to remove the said barrier layer.

21. The method of forming a quantum well device as described in claim 1, its characteristic lies in the material of the said source and drain regions is silicon-doped GaN.

22. The method of forming a quantum well device as described in claim 21, its characteristic lies in the said source and drain regions are formed by MOCVD, ALD or MBE processes.

23. The method of forming a quantum well device as described in claim 1, its characteristic lies in source and drain electrodes are formed at the source and drain regions.

24. A quantum well device formed by claim 1 of the method of forming a quantum well device, its characteristic lies in including the following specifics: patterned substrate, buffer layer with fin-like structure, quantum well layer, barrier layer, cover layer, metal gate, gate dielectric layer, sidewall spacer and source-drain regions wherein the said fin-like structure of the buffer layer is formed on the patterned substrate, the said quantum well layer, the barrier layer, the cover layer, the gate dielectric layer and the metal gate are successively formed on the said buffer layer with fin-like structure, the said sidewall spacer is formed at both sides of the metal gate and the gate dielectric layer, the said doped source and drain are formed in the said buffer layer, located at both sides of the metal gate and the gate dielectric layer with some part extending to the bottom of the sidewall spacer.

25. The quantum well device as described in claim 24, its characteristic lies in it also includes source and drain electrodes, the said source and drain electrodes are formed on the said source and drain regions.

* * * * *